United States Patent
Xu et al.

(10) Patent No.: US 10,823,758 B2
(45) Date of Patent: Nov. 3, 2020

(54) CONICAL NANO-CARBON MATERIAL FUNCTIONALIZED NEEDLE TIP AND PREPARATION METHOD THEREFOR

(71) Applicant: National Center for Nanoscience and Technology, Beijing (CN)

(72) Inventors: Jianxun Xu, Beijing (CN); Yuliang Zhao, Beijing (CN)

(73) Assignee: National Center for Nanoscience and Technology, Beijing (CN)

( * ) Notice: Subject to any disclaimer, the term of this patent is extended or adjusted under 35 U.S.C. 154(b) by 74 days.

(21) Appl. No.: 16/086,821

(22) PCT Filed: Mar. 29, 2016

(86) PCT No.: PCT/CN2016/077671
§ 371 (c)(1),
(2) Date: Sep. 20, 2018

(87) PCT Pub. No.: WO2017/140011
PCT Pub. Date: Aug. 24, 2017

(65) Prior Publication Data
US 2019/0107556 A1    Apr. 11, 2019

(30) Foreign Application Priority Data
Feb. 18, 2016  (CN) .......................... 2016 1 0091160

(51) Int. Cl.
*G01R 1/067*    (2006.01)
*B81C 1/00*    (2006.01)
(Continued)

(52) U.S. Cl.
CPC .............. *G01R 1/0675* (2013.01); *B81B 1/00* (2013.01); *B81C 1/00* (2013.01); *B82Y 30/00* (2013.01);
(Continued)

(58) Field of Classification Search
CPC .............. G01R 1/0675; G01R 1/06738; G01R 1/06744; G01R 1/06755; B81B 1/00;
(Continued)

(56) References Cited

U.S. PATENT DOCUMENTS 6,019,086 A * 2/2000 Schneider ............. F02P 7/0775
 123/406.18
6,930,313 B2 * 8/2005 Fujieda .................. B82Y 10/00
 250/423 F (Continued)

FOREIGN PATENT DOCUMENTS

CN    101049906 A    10/2007
CN    101227940 A    7/2008
(Continued)

OTHER PUBLICATIONS

Zhang, H. et al. An ultrabright and monochromatic electron point source made of a LaB6 nanowire. Nature Nanotech. doi:10.1038/nnano.2015.276 (2015).
(Continued)

*Primary Examiner* — Dominic E Hawkins
(74) *Attorney, Agent, or Firm* — TraskBritt

(57) ABSTRACT

Provided is a conical nano-carbon material functionalized needle tip, formed by assembling a nano-carbon material with a material of a needle tip by means of a covalent bond; and the material of the needle tip is a metal selected from one or more of tungsten, iron, cobalt, nickel and titanium. Further provided is a method for preparing the conical nano-carbon material functionalized needle tip. The conical nano-material functionalized needle tip has an outstanding interface formed by metal-carbide covalent bonds, and the orientation of the conical nano-material is matched with the axial direction of the metal needle tip (illustrated in FIG. 6). The proposed preparation method affords a robust interface and avoids the potential pollution to the nano-material (Continued)

caused during the deposition of fixing materials, such as carbon or platinum or the like, in other preparation methods.

6 Claims, 4 Drawing Sheets

(51) Int. Cl.
| | | |
|---|---|---|
| B81B 1/00 | (2006.01) | |
| G01Q 70/10 | (2010.01) | |
| G01Q 70/18 | (2010.01) | |
| B82Y 30/00 | (2011.01) | |
| G01Q 30/02 | (2010.01) | |
| G01Q 70/12 | (2010.01) | |
| G01R 3/00 | (2006.01) | |

(52) U.S. Cl.
CPC ............ *G01Q 30/02* (2013.01); *G01Q 70/10* (2013.01); *G01Q 70/12* (2013.01); *G01Q 70/18* (2013.01); *G01R 1/06738* (2013.01); *G01R 1/06744* (2013.01); *G01R 1/06755* (2013.01); *G01R 3/00* (2013.01)

(58) Field of Classification Search
CPC ........ B81B 1/008; G01Q 70/10; G01Q 70/18; G01Q 70/12
See application file for complete search history.

(56) References Cited

U.S. PATENT DOCUMENTS

| | | | | |
|---|---|---|---|---|
| 7,064,341 | B2* | 6/2006 | Nakayama | G01Q 60/38 250/492.3 |
| 8,766,522 | B1* | 7/2014 | Fairchild | H01J 1/304 313/346 R |
| 9,257,257 | B2* | 2/2016 | Fujita | H01J 35/06 |
| 2004/0026629 | A1* | 2/2004 | Fujieda | H01J 37/073 250/423 R |
| 2009/0038820 | A1* | 2/2009 | Keefer | A61N 1/0551 174/119 C |
| 2009/0082216 | A1* | 3/2009 | Cohn | B82Y 40/00 506/9 |
| 2009/0126487 | A1* | 5/2009 | Boiste | G01P 1/023 73/494 |
| 2010/0066402 | A1* | 3/2010 | Fujita | G01R 3/00 324/755.01 |
| 2011/0163772 | A1 | 7/2011 | Kim et al. | |
| 2012/0077020 | A1* | 3/2012 | Muramatsu | C01B 32/18 428/319.1 |
| 2014/0345985 | A1* | 11/2014 | Miller | F16D 27/02 188/79.55 |
| 2015/0198623 | A1* | 7/2015 | Dalisdas | G01P 1/026 701/70 |
| 2016/0231347 | A1* | 8/2016 | Kaufner | G01D 5/2451 |
| 2019/0101563 | A1* | 4/2019 | Endres | G01D 5/142 |

FOREIGN PATENT DOCUMENTS

| | | |
|---|---|---|
| CN | 102525421 A | 7/2012 |
| WO | 2005046305 A2 | 5/2005 |
| WO | 2009023579 A2 | 2/2009 |

OTHER PUBLICATIONS

Wilson, N. R. & Macpherson, J. V. Carbon nanotube tips for atomic force microscopy. Nature Nanotechn. 4, 483-491, (2009).
Slattery, A.D., Blanch, A.J., Quinton, J.S., Gibson, C.T. Efficient attachment of carbon nanotubes to conventional and high-frequency AFM probes enhanced by electron beam processes, Nanotechnol. 24, 235705, (2013).
Shang, N. G. et al. Fe catalytic growth, microstructure, and low-threshold field emission properties of open ended tubular graphite cones. J. Appl. Phys. 103, (2008).
Muradov, N. & Schwitter, A. Formation of conical carbon structures on vapor-grown carbon filaments. Nano. Lett. 2, 673-676, (2002).
Martinez, J., Yuzvinsky, T.D., Fennimore, A.M., Zettl, A., Garcia, R., Bustamante, C. Length control and sharpening of atomic force microscope carbon nanotube tips assisted by an electron beam, Nanotechnol. 16, 2493-2496, (2005).
Mani, R. C., Li, X., Sunkara, M. K. & Rajan, K. Carbon nanopipettes. Nano. Lett. 3, 671-673, (2003).
Krishnan, A. et al. Graphitic cones and the nucleation of curved carbon surfaces. Nature 388, 451-454, (1997).
Houdellier, F. et al. Development of TEM and SEM high brightness electron guns using cold-field emission from a carbon nanotip. Ultramicroscopy 151, 107-115, (2015).
Gogotsi, Y., Dimovski, S. & Libera, J. A. Conical crystals of graphite. Carbon 40, 2263-2267, (2002).
De Jonge, N. Carbon Nanotube Electron Sources for Electron Microscopes. Adv. Imag. Elect. Phys. 156, 203-233, (2009).
De Jonge, N. & Bonard, J. M. Carbon nanotube electron sources and applications. Philos. T. R. Soc. A 362, 2239-2266, (2004).
International Search Report for PCT Application No. PCT/CN2016/077671 dated Nov. 17, 2016, 7 pages with translation.
Written Opinion of the International Searching Authority for PCT Application No. PCT/CN2016/077671 dated Nov. 17, 2016, 7 pages with translation.
Chinese First Office Action for Chinese Application No. 201610091160 dated Jan. 5, 2017, 5 pages.
Sharma et al., "Field emission from carbon nanotubes grown on a tungsten tip", Chemical Physics Letters, vol. 344, Issues 3-4, (Aug. 2001) pp. 283-286.

\* cited by examiner

CONICAL NANO-CARBON MATERIAL FUNCTIONALIZED NEEDLE TIP AND PREPARATION METHOD THEREFOR

CROSS-REFERENCE TO RELATED APPLICATIONS

This application is a national phase entry under 35 U.S.C. § 371 of International Patent Application PCT/CN2016/077671, filed Mar. 29, 2016, designating the United States of America and published as International Patent Publication WO 2017/140011 A1 on Aug. 24, 2017, which claims the benefit under Article 8 of the Patent Cooperation Treaty to Chinese Patent Application Serial No. 201610091160.0, filed Feb. 18, 2016.

TECHNICAL FIELD

The present invention belongs to the field of functionalization of metal materials, and particularly relates to a needle tip modified by a nano-carbon material and a preparation method thereof.

BACKGROUND ART

With the rapid development of nano-materials and nano-technology, researchers have prepared a number of new nano-material functionalized needle tips, mainly including carbon nanotube tips, and needle tips modified by one-dimensional/quasi-one-dimensional nano-materials such as nanowires. Nano-material functionalized needle tips have a widespread application in the fields such as scanning probe microscopes, electron emission sources, and biological probes.

At present, the main methods for preparing nano-material functionalized needle tips include in-situ growth method, electrophoresis method, atomic force microscope tip extraction method and microoperation system-based preparation method[1, 2]. The microoperation system allows researchers to use micromanipulator arm to control the precise movement of metal needle tip under optical or electron microscopy, and to attach the specific nano-materials to the front end of the metal needle tip. The microoperation system has relatively high controllability, and thus has become a widely used tool in the process of preparing nano-material functionalized needle tip. The researchers used a micromanipulator arm to control the metal needle tip or an atomic force microscope tip to extract the selected nano-materials. However, up to now, all microoperation system-based methods utilize physical adsorption to adhere nano-materials to the front end of the needle tip, and to increase the contact area at the junction by depositing carbon or tungsten at the contact interface between the nano-material and the needle tip so as to fix nano-materials[3-5]. The nano-material functionalized needle tip prepared by this method has high interface resistance and low mechanical strength, which largely limits the practical application of the nano material functionalized needle tip. In addition, up to now, all the preparation methods of the needle tip cannot directly ensure that the orientation of the one-dimensional/quasi-one-dimensional nano-materials is consistent with the axial direction of the metal needle tip, which becomes a technical difficulty for the wide application of the nano-materials functionalized needle tip[2, 6].

On the other hand, in the field of nano-material functionalized needle tip, one-dimensional/quasi-one-dimensional nano-carbon materials, including carbon nanotubes and conical nano-carbon materials[7], have garnered considerable attention due to their special structure and excellent electrical and mechanical properties. The conical nano-carbon material functionalized needle tip has higher structural stability than the carbon nanotube needle tip, and may have special applications in the fields of scanning probe microscope, electron emission source and the like. However, most of the synthetic conical nano-carbon materials have many structural defects, and the tail of the cone is closely connected with the substrate material, such that they are not suitable for the preparation of nano-functionalized needle tips[8-11]. In related reports, the researchers used a focused ion beam to cut and separate the tail of a conical nano-carbon material from the substrate, and then controlled the metal needle tip to contact with the conical nano-carbon material using a microoperation system so as to obtain a conical nano-carbon material functionalized needle tip. However, in the above-mentioned reports, all the conical nano-carbon materials are fixed on the front end of the metal needle tip by depositing materials such as carbon or tungsten with the aid of electron beam or ion beam, and the conical nano-carbon material and the metal needle tip are connected to each other only by physical force[12]. Till now, there has been no report on the nano-carbon functionalized needle tips interfaced by a metal carbide (covalent bond) interface and with a controlled apex orientation.

REFERENCES

1. Wilson, N. R. & Macpherson, J. V. Carbon nanotube tips for atomic force microscopy. Nature Nanotechn. 4, 483-491, (2009)
2. de Jonge, N. Carbon Nanotube Electron Sources for Electron Microscopes. Adv. Imag. Elect. Phys. 156, 203-233, (2009).
3. de Jonge, N. & Bonard, J. M. Carbon nanotube electron sources and applications. Philos. T. R. Soc. A 362, 2239-2266, (2004).
4. Slattery, A. D., Blanch, A. J., Quinton, J. S., Gibson, C. T. Efficient attachment of carbon nanotubes to conventional and high-frequency AFM probes enhanced by electron beam processes, Nanotechnol. 24, 235705, (2013).
5. Zhang, H. et al. An ultrabright and monochromatic electron point source made of a LaB6 nanowire. Nature Nanotech. doi:10.1038/nnano.2015.276 (2015).
6. Martinez, J., Yuzvinsky, T. D., Fennimore, A. M., Zettl, A., Garcia, R., Bustamante, C. Length control and sharpening of atomic force microscope carbon nanotube tips assisted by an electron beam, Nanotechnol. 16, 2493-2496, (2005).
7. Krishnan, A. et al. Graphitic cones and the nucleation of curved carbon surfaces. Nature 388, 451-454, (1997).
8. Shang, N. G. et al. Fe catalytic growth, microstructure, and low-threshold field emission properties of open ended tubular graphite cones. J. Appl. Phys. 103, (2008).
9. Gogotsi, Y., Dimovski, S. & Libera, J. A. Conical crystals of graphite. Carbon 40, 2263-2267, (2002).
10. Muradov, N. & Schwitter, A. Formation of conical carbon structures on vapor-grown carbon filaments. Nano. Lett. 2, 673-676, (2002).
11. Mani, R. C., Li, X., Sunkara, M. K. & Rajan, K. Carbon nanopipettes. Nano. Lett. 3, 671-673, (2003).
12. Houdellier, F. et al. Development of TEM and SEM high brightness electron guns using cold-field emission from a carbon nanotip. Ultramicroscopy 151, 107-115, (2015).

BRIEF SUMMARY

In view of the deficiencies of the prior art, one of the objects of the present invention is to provide a conical nano-material functionalized needle tip having good interfacial contact and high bonding strength, with the orientation of the conical nano-material perfectly matched with the axial direction of the metal needle tip.

Another object of the present invention is to provide a preparation method of the conical nano-material functionalized needle tip.

The technical solution for achieving the above object of the present invention is given as follows:

A conical nano-carbon material functionalized needle tip is formed by combining a nano-carbon material with a material of a needle tip by means of a covalent bond; and the material of the needle tip is metal which is one or more selected from tungsten, iron, cobalt, nickel and titanium.

Further, the portion of the needle tip combined with nano-carbon material has a length of 0.1 μm to 10 μm, and the nano-carbon material has a conical shape, of which the inner wall of the conical side is fused with the top of the needle tip, thereby the nano-carbon material being covered on the needle tip. The functionalized needle tip has the characteristic of matched orientation, i.e., the orientation of the nano-carbon material is consistent with the axial direction of the metal needle tip.

The needle is in the shape of a conventional needle, and the vertex angle of the tip can be 10° to 70°. The conical nano-carbon material can completely cover the needle tip, or partially cover the needle tip, with a part of the conical nano-carbon material does not contact the needle tip.

More preferably, the nano-carbon material has a conical shape, the center line of which coincides with the axial center line of the needle body.

The functionalized needle tip of the present invention may be a metal needle tip or a metal plated needle tip that can form metal carbide with carbon. In the preparation method of the functionalized needle tip, the method such as high temperature furnace heating or laser irradiation or electric current heating can be employed to heat the metal needle tip so that the top of the metal needle tip partially melts and reacts with carbon to form metal carbide. As a preference, a technical solution of the preparation method is provided below.

A preparation method of a conical nano-carbon material functionalized needle tip, comprising the steps of:

1) depositing a conical nano-carbon material on the silicon wafer substrate by using a spin coater;
2) inserting the tip of a needle into the top of the conical nano-carbon material, contacting the needle body with another metal form, applying a voltage between the metal form and the needle body, so that electric current passes through the needle body, and the tip portion of the needle is heated and combined with the nano-carbon material adhered thereto.

Wherein, in step 2), the metal form has a spherical or platform-shaped top. The position of the metal form in contact with the needle body is 0.2 μm to 100 μm away from the top of the needle tip.

Here, the invention proposes a manner for obtaining the metal form having a spherical or platform-shaped top:

In the step 2), the other metal form is made from a metal needle (#1) by allowing the metal needle (#1) to approach the side wall of the needle (#2) body at the position 1 to 100 μm away from the top of the needle (#2) tip, and applying a voltage of 20 V to 100 V between the metal needle (#1) and the needle (#2) body such that an arc occurs between the metal needle and the needle body, which causes the top of the metal needle to melt into a spherical shape or a platform shape.

Wherein, in step 2), the electric current passing through the needle body is 0.01 A to 5 A.

Preferably, both materials of the metal form and the top of the needle tip are tungsten; in the step 2), the electric current passing through the needle body is 0.04 A to 4 A.

Wherein, the metal form and the needle body are both fixed on the micromanipulator arm and operated under a microscope.

In the microoperation system, the metal needle tip is fixed on the micromanipulator arm, and precise movement thereof in three dimensions can be achieved under the microscope. Under the control of the microoperation system shown in FIG. 1, a metal needle tip is melted by arc discharge on the surface of another metal needle tip to obtain a metal needle tip with a top of spherical structure. Based on the material of the metal needle tip and the tip size, the voltage range of the arc discharge is 20 V to 100 V. The local high temperature generated by the discharge meanwhile cleans the surface of the metal needle tip having a sharp tip. Under the control of the micromanipulator arm, the needle tip gradually approaches the conical nano-material deposited on the substrate, and is inserted into the tail of the conical nano-material and contacted with the inner surface, and the conical nano-material leaves the surface of the substrate after being adhered to the top of the metal needle tip. The nano-materials and metal needle tip which are attached only by the physical adsorption force have a small contact area and loose connection, and the nano-material easily moves or falls off the metal needle tip.

The key for preparing a high quality nano-material functionalized needle tip lies in controlling the fusion of the front end of the metal needle tip and the portion of the nano-material adjacent to the metal needle tip to form good interfacial connection between the nano-material and the metal needle tip. Under the action of external energy, the front end of the metal needle tip is more easily to accumulate heat due to its smaller size, so it is easier to be melted than other parts with a larger size. Under certain conditions, only the portion at the top of the metal needle tip, which is adjacent to the nano-material, is melted, the melted metal needle tip is in close contact with the surface of the nano-material and may chemically react therewith at this high temperature to form covalent bond connection, and good interfacial connection is formed between the metal needle tip and the nano-material after cooling. In the present invention, optimal process parameters for preparing the conical nano-carbon material functionalized needle tip will be described.

According to the method described above, the conical nano-carbon material is adhered to the metal needle tip, and the tip of the metal needle tip is in contact with the inner surface of the conical nano-carbon material. Two metal needle tips are moved, and one needle tip having a spherical structure at top is contacted with another needle tip adhered with nano-material to form an electrical pathway (see FIG. 2); a voltage is applied between the two needle tips to generate sufficient current, the Joule heat generated by the current causes the region where the top of the needle tip is in contact with the conical nano-carbon material to melt. The magnitude and time of the applied current must be appropriate. If the current is too small, the metal needle tip cannot be melted. If the current is too large and the time is too long, the needle tip will be broken. The factors that determine the required current include the materials of the metal needle tip, the tip size, the contacting manner and the position of the contact point of the metal needle tip. Under the experimental conditions used by the inventors, the magnitude of the applied current ranges from 0.01 A to 5 A, but is not limited thereto. Under the optimal conditions, the most front end of the metal needle tip melts while the rest is still solid. The tip melting part automatically enters and fills the inner space of the conical nano-carbon material. At the same time, due to the surface tension effect of the metal micro-droplets formed by melting, the orientation of the conical nano-carbon material is automatically adjusted to be consistent with the axial direction of the metal needle tip. After the melted metal is cooled and solidified, an interface where the inner conical surface of the conical nano-carbon material is in complete and close contact with the metal is obtained. At the same time, the high-temperature melted metal droplets can chemically react with the carbon atoms in the inner conical surface of the conical nano-carbon material to form metal carbide, and a conical nano-carbon material functionalized needle tip connected by the metal carbide interface is obtained.

The beneficial effects of the invention are provided as follows:

The conical nano material functionalized needle tip prepared by the method of the invention has good interface contact, and the orientation of the conical nano-material is matched with the axial direction of the metal needle tip. At the same time, contamination of nano-materials during the deposition of fixed materials such as carbon or tungsten in other preparation methods is avoided. The conical nano-carbon material functionalized needle tip prepared under optimal conditions has a metal carbide bonded interface. Due to the excellent electrical conductivity and hardness of the metal carbide, the conical nano-carbon material functionalized needle tip prepared by the method of the present invention has better electrical conductivity and higher mechanical strength than the existing functionalized needle tips.

BRIEF DESCRIPTION OF THE DRAWINGS

FIG. 2, Panel a, shows that the tip of #1 needle is in contact with #2 needle at the position about 3 μm away from the tip; FIG. 2, Panel b, shows that the needle body of #1 needle is in contact with #2 needle at the position about 20 μm away from the tip, as described in Example 4.

FIG. 6, Panels c and d, show scanning electron micrographs of another two conical nano-carbon material functionalized needle tips having different apex angles prepared by the same method.

In the figures, 1 is a microscope objective lens, 2 is a micromanipulator arm, 3 is a sample stage, 4 is a metal needle tip, 5 is a metal carbide interface, 6 is a conical nano-carbon material, 7 is a contact interface, and 8 is a conical nano-material adhered on the metal needle tip.

DETAILED DESCRIPTION

The following preferred Examples are used to illustrate the invention, but not intended to limit the scope of the invention.

The micromanipulator arm used in the Examples was a product from Kleindiek Nanotechnik.

Conical nano-carbon materials were purchased from n-Tec, Norway. The related literature is Krishnan, A. et al. Graphitic cones and the nucleation of curved carbon surfaces. Nature 388, 451-454, doi:Doi 10.1038/41284 (1997)., i.e., the reference 7 cited in the section of Background Art.

The spin coater is a KW-4A type spin coater produced by the Institute of Electronics of the Chinese Academy of Sciences.

Example 1

Figure 1:
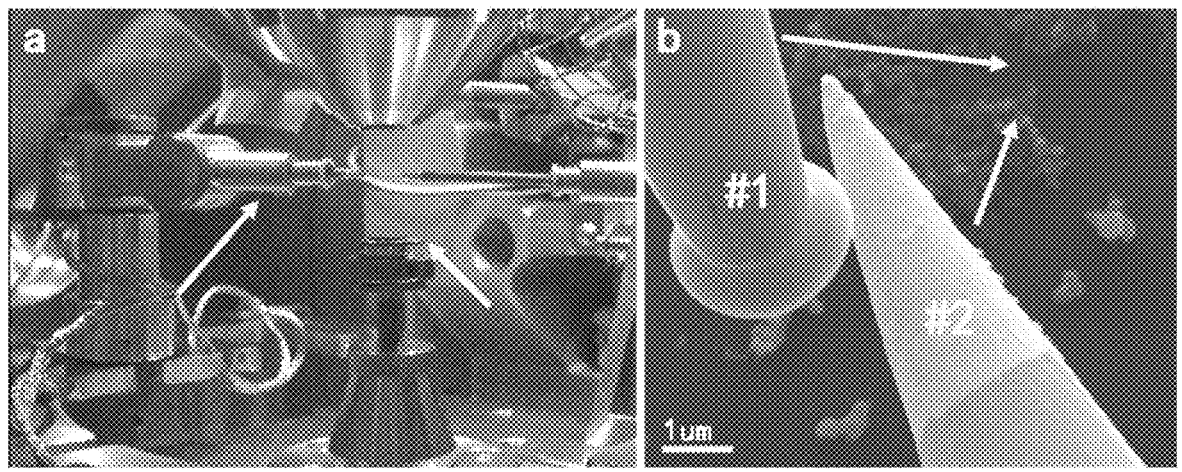
FIG. 1, Panel a, shows a photograph of a microoperation system installed in a scanning electron microscope, and FIG. 1, Panel b, is a photomicrograph showing that the tip of the metal needle tip #1 is formed into a needle tip with a spherical top structure by arc discharge on the surface of the needle tip #2.
Figure 3:
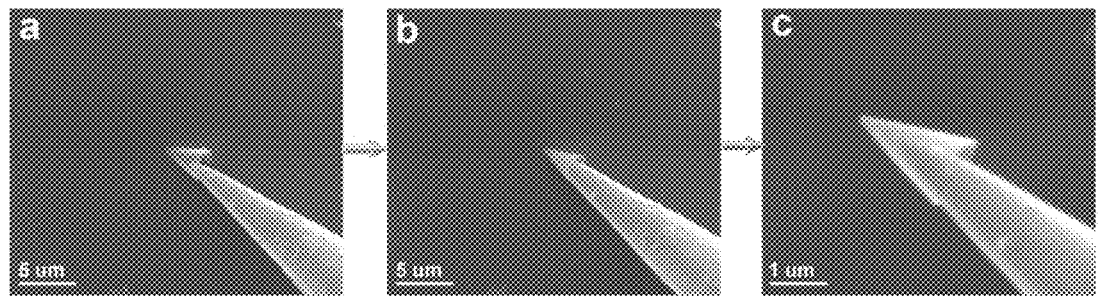
FIG. 3 shows the process of controlling the metal tungsten needle tip to adhere to the conical nano-carbon material using a micromanipulator arm.

The conical nano-carbon material was dispersed in the solvent of dichlorobenzene by ultrasonication, and the conical nano-carbon material in the obtained dispersion liquid was dispersed and deposited on the silicon wafer substrate by a spin coater, and then the silicon wafer substrate was installed on the sample stage 3 of a scanning electron microscope (FIG. 1, Panel a). The metal tungsten needle tip (#2) gradually approached and was inserted into the inner space of the conical nano-carbon material under the control of the micromanipulator arm 2, as shown in FIG. 3, Panels a to c. After the metal tungsten needle tip was in physical contact with the inner surface of the conical nano-carbon, the needle tip was moved upward by the micromanipulator arm to separate the conical nano-carbon material from the surface of the substrate.

Figure 4:
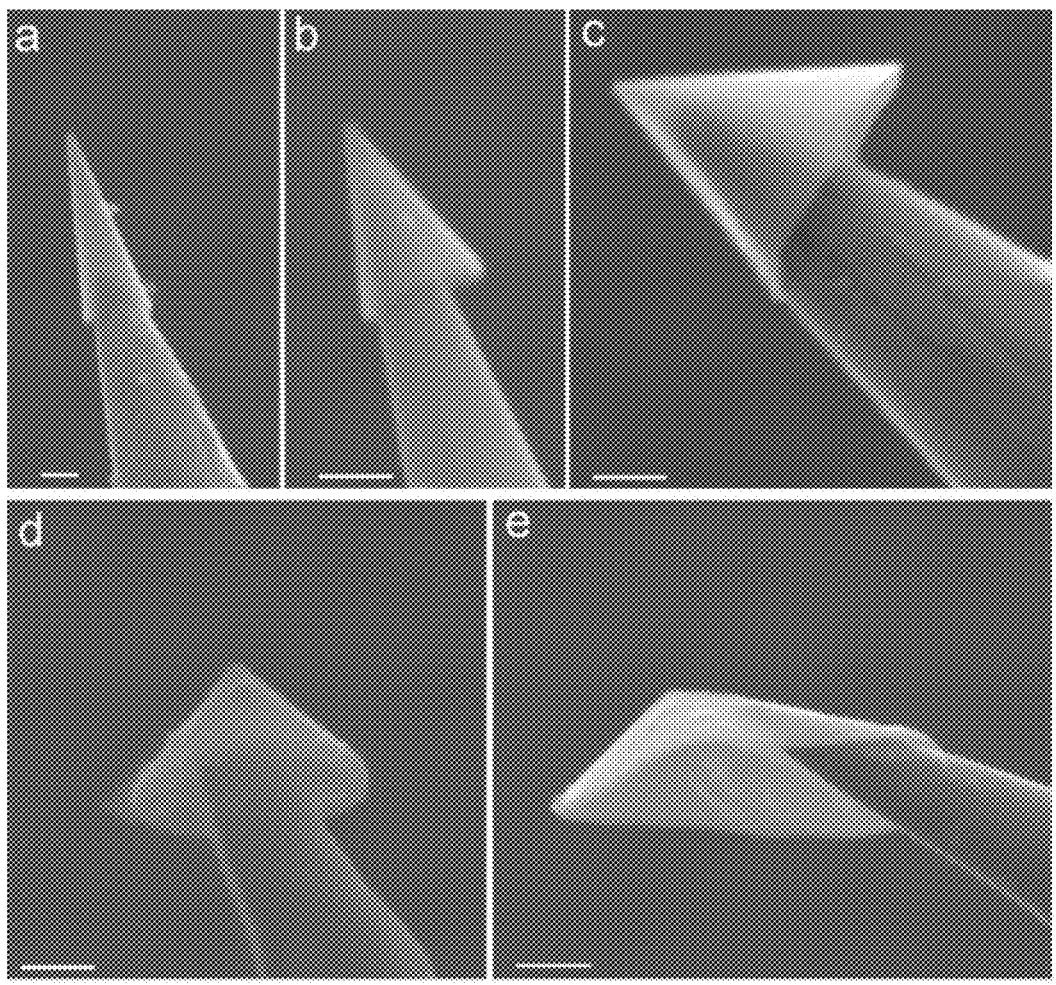
FIG. 4 shows the photomicrographs of the conical nano-carbon material having different cone angles and morphologies adhered to the top of a metal tungsten needle tip, as described in Example 1. The plotting scale in FIG. 4 is 500 nm.

FIG. 4, Panels a through e, shows the photographs of the conical nano-carbon material having different cone angles and morphologies adhered to the top of a metal tungsten needle tip. In FIG. 4, Panel a, the cone had a generatrix with a length of about 2 μm, and an apex angle of about 20°. In FIG. 4, Panel b, the cone had a generatrix with a length of about 1 μm, and an apex angle of about 40°. In FIG. 4, Panel c, the cone had a generatrix with a length of about 1 μm, and an apex angle of about 60°. In FIG. 4, Panel d, the cone had a generatrix with a length of about 1 μm, and an apex angle of about 80°. In FIG. 4, Panel e, the cone had a generatrix with a length of about 2 μm, and an apex angle of about 120°.

Example 2

The dispersion of the conical nano-carbon material was the same as that in Example 1. In this Example, first, a tungsten needle (#1) was allowed to approach the side wall of the #2 needle tip at the position 10 μm away from the top of the #2 needle tip, and a voltage of 60 V was applied between the #1 tungsten needle and the #2 needle body, so that an arc occurred between the #1 tungsten needle and the #2 needle body, which caused the top of the #1 tungsten needle to melt into a spherical shape.

The tip of the #2 needle was inserted into the top of the conical nano-carbon material (the length of the generatrix of the cone was about 1 and the apex angle was about) 60° and contacted with the conical nano-carbon material 6, so that the conical nano-carbon material 6 was adhered to the top of the tungsten needle tip.

Figure 5:
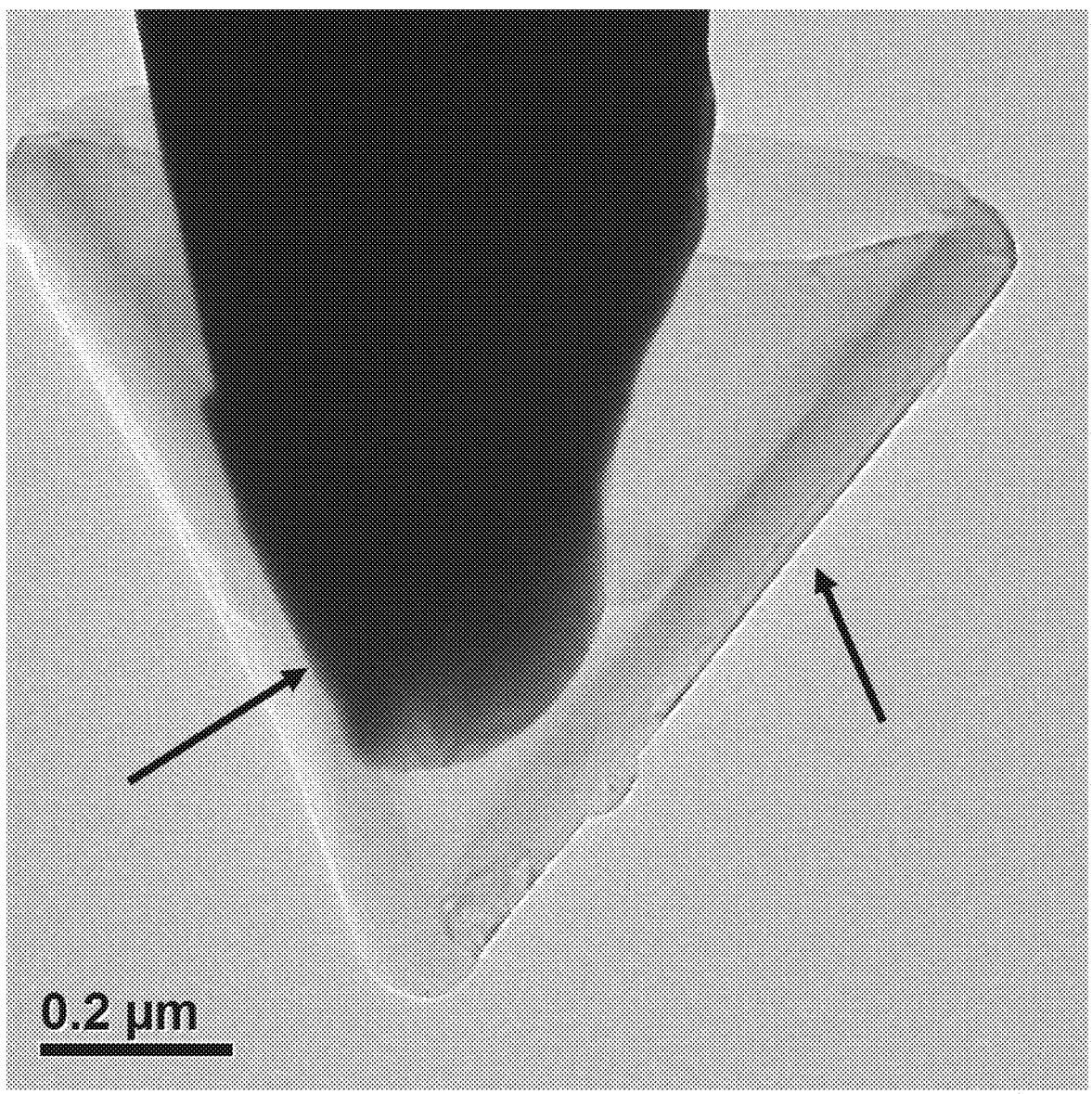
FIG. 5 shows a transmission electron microscope photograph of a functionalized needle tip obtained by melting a small area of the top of the tungsten needle tip and then allowing it to form metal carbide interface with the conical nano-carbon material.

Thereafter, the spherical top of the #1 tungsten needle was directly contacted with the outer surface of the conical nano-carbon on the above tungsten needle tip (#2), with the contact point 0.2 μm away from the top end of the needle tip #2. A voltage was applied to the two tungsten needle tips to generate a current of 0.04 A. The metal tungsten needle tip (#2) was melted in a small area, and the melted tungsten was chemically reacted with the inner surface of the conical nano-carbon in contacted therewith at a high temperature to form tungsten carbide. A functionalized needle tip as shown in FIG. 5 was obtained. X-ray photoelectron spectroscopy analysis results show that the melted tungsten reacts with the inner surface of the conical nano-carbon in contact therewith to form tungsten carbide. The test results of this Example show that the obtained conical nano-carbon functionalized needle tip has a resistance of 600Ω (the resistance was obtained by measuring with direct current to give an I/V curve and calculating based on the curve, and the device employed was the Keithley 4200 analysis system), and the flexural rigidity of the top of the needle tip was 38 N/m.

Example 3

Figure 2:
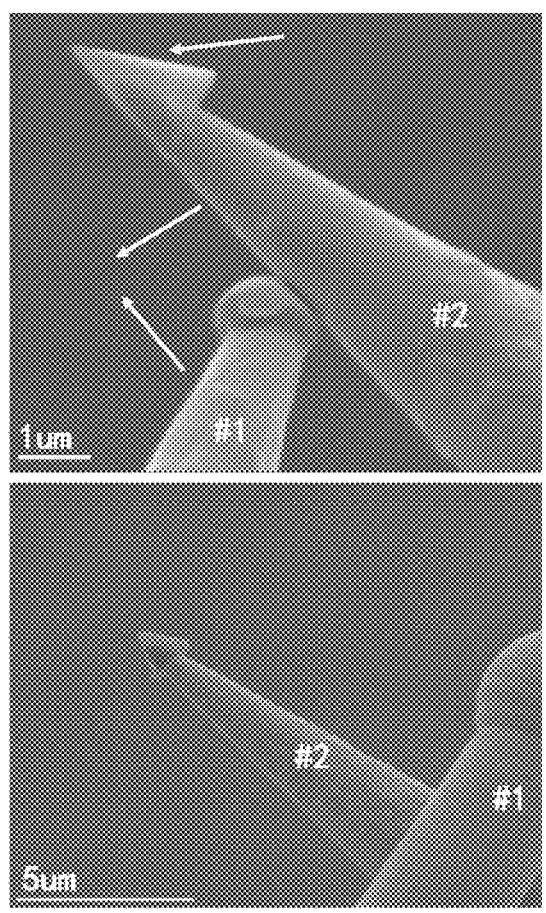
FIG. 2 shows a scanning electron micrograph of metal needle tip #1 in contact with needle tip #2.
Figure 6:
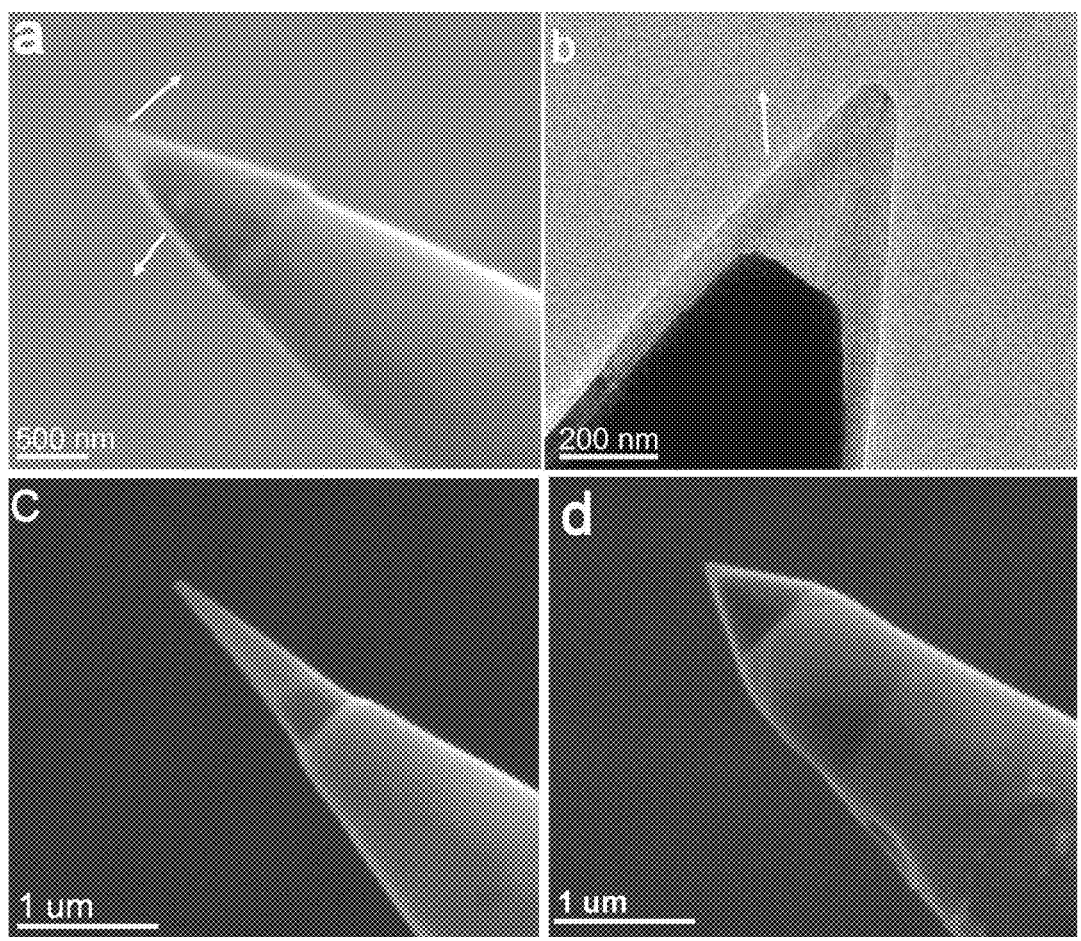
FIG. 6 shows a scanning electron microscope photograph (FIG. 6, Panel a) and a transmission electron microscope photograph (FIG. 6, Panel b) of a functionalized needle tip obtained by melting a large area of the top of the tungsten needle tip and then allowing it to form metal carbide interface with the conical nano-carbon material, wherein the molten tungsten needle tip fills up the tail of the conical nano-material and closely contacts therewith.

In this Example, a conical nano-carbon material (the apex angle of the cone was about 40°) was adhered to the top of the tungsten needle tip. Thereafter, the spherical top of the other tungsten needle tip (#1) was brought into contact with the above tungsten needle tip (#2), and the contact position was about 3 μm away from the top of the needle tip #2 (FIG. 2, Panel a). A voltage was applied to the two tungsten needle tips to generate a current of 3 A with a duration of 0.25 ms, resulting in a functionalized needle tip as shown in FIG. 6, Panels a and b. In this Example, the metal tungsten needle tip (#2) was melted in a large area, and the melted metal tungsten automatically entered and filled the inner space of the conical nano-carbon, and the orientation of the conical nano-carbon was matched with the axial direction of the tungsten needle tip. X-ray photoelectron spectroscopy analysis results show that at this high temperature, the melted tungsten reacts with the inner surface of the contacted conical nano-carbon to form tungsten carbide. The various test results of this Example show that the obtained conical nano-carbon needle tip has a resistance of 22Ω, and the flexural rigidity of the top of the needle tip was 700 N/m.

The other operations of this Example were the same as those of Example 2.

FIG. 6, Panels c and d show the functionalized needle tips made under the same operating conditions of this Example. The apex angles of the nano-carbon material covered on the needle tip are 20° and 60°, respectively.

Example 4

In this Example, a conical nano-carbon material (the apex angle of the cone was about 40°) was adhered to the tip of the tungsten needle tip. Thereafter, the spherical top of another tungsten needle tip (#1) was brought into contact with the above tungsten needle tip (#2), and the contact position was about 20 μm away from the top of the needle tip #2 (FIG. 2, Panel b). A voltage was applied to the two tungsten needle tips to generate a current of 1 A, and the #2 tungsten needle tip was partially melted, and the melted portion chemically reacted with the inner surface of the conical nano-carbon in contact therewith to form tungsten carbide. X-ray photoelectron spectroscopy analysis results show that at this high temperature, the melted tungsten reacts with the inner surface of the conical nano-carbon in contact therewith to form tungsten carbide. Various test results of this Example show that the obtained conical nano-carbon needle tip has a resistance of 350Ω, and the flexural rigidity of the top of the needle tip is 220 N/m.

The other operations of this Example were the same as those of the Example 2.

Example 5

A titanium needle (#1) was allowed to approach the side wall of the #2 needle tip at the position 20 μm away from the top of the #2 needle tip, and a voltage of 20 V was applied between the #1 tungsten needle and the #2 needle body, so that an arc occurred between #1 titanium needle and the #2 needle body, which caused the top of the #1 titanium needle to melt into a spherical shape.

The tip of the #2 titanium needle was inserted into the top of the conical nano-carbon material (the length of the generatrix of the cone was about 1 μm, and the apex angle was about 60°) and contacted with the conical nano-carbon material, so that the conical nano-carbon material was adhered to the top of the titanium needle tip.

Thereafter, the spherical top of the #1 titanium needle was directly contacted with the outer surface of the conical nano-carbon on the #2 titanium needle tip, and the contact point was 0.5 μm away from the top end of the needle tip #2. A voltage was applied to the two titanium tips to generate a current of 0.5 A. The #2 needle tip was melted in a small area, and the melted portion chemically reacted with the inner surface of the conical nano-carbon in contact therewith to form titanium carbide. The other operations were the same as those of Example 2.

The obtained conical nano-carbon needle tip has a resistance of 500Ω, and the flexural rigidity of the top of the needle tip is 60 N/m.

The Examples described above are merely preferred embodiments of the present invention, but not intended to limit the scope of the invention. A person skilled in the art may make various modifications and improvements to the technical solutions of the present invention without departing from the designing spirit, and the modifications and improvements all fall within the protection scope defined by the appended claims of the invention.

INDUSTRIAL APPLICABILITY

The invention provides a conical nano-carbon material functionalized needle tip, wherein the conical nano-carbon material functionalized needle tip is formed by combining a nano-carbon material with a material of a needle tip by means of a covalent bond; and the material of the needle tip is a metal which is one or more selected from tungsten, iron, cobalt, nickel and titanium. The invention also provides a method for preparing the conical nano-carbon material functionalized needle tip, wherein the prepared conical nano-carbon needle tip has firm metal carbide interface connection; the orientation of the loaded conical nano-carbon is perfectly matched with the axial direction of the metal needle tip. Due to the excellent electrical conductivity and hardness of the metal carbide, the conical nano-carbon material functionalized needle tip of the present invention has better electrical conductivity and higher mechanical strength than the existing functionalized needle tip.

What is claimed is:

1. A conical nano-carbon material functionalized needle tip comprising:
   a nano-carbon material;
   a needle tip;
   wherein the nano-carbon material is combined with a material of the needle tip by means of a covalent bond;
   wherein the material of the needle tip is a metal which is one or more selected from tungsten, iron, cobalt, nickel and titanium;
   wherein a portion of the needle tip combined with the nano-carbon material has a length of 0.1 to 10 μm; and
   wherein the nano-carbon material has a conical shape, of which an inner wall of a conical side is fused with a top of the needle tip, thereby covering the needle tip with the nano-carbon material.

2. The conical nano-carbon material functionalized needle tip according to claim 1, wherein, the nano-carbon material has a conical shape, the center line of which coincides with the axial center line of a body of the needle tip.

3. A method of forming a conical nano-carbon material functionalized needle tip, comprising the steps of:
   1) depositing a conical nano-carbon material on a silicon wafer substrate by using a spin coater;
   2) inserting the tip of a needle into the top of the conical nano-carbon material and adhering it to the conical nano-carbon material, contacting a body of the needle with a metal form, applying a voltage between the metal form and the body of the needle, so that electric current passes through the body of the needle, and a tip portion of the needle is heated and combined with the nano-carbon material adhered thereto; wherein
   in the step 2), the metal form has a spherical or platform-shaped top, a position of the metal form in contact with the body of the body is 0.2 to 100 μm away from the top of the needle tip, the metal form is made from a metal needle by allowing the metal needle to approach a side wall of the body of the needle at the position 1 to 100 μm away from the top of the needle tip, and applying a voltage of 20 to 100 V between the metal needle and the body of the needle such that an arc occurs between the metal needle and the body of the needle, which causes the top of the metal needle to melt into a spherical shape or a platform shape.

4. The method according to claim 3, wherein, in the step 2), the electric current passing through the body of the needle is 0.01 to 5 A.

5. The method according to claim 4, wherein both materials of the metal form and the top of the needle tip are tungsten; and, in the step 2), the electric current passing through the body of the needle is 0.04 to 4 A.

6. The method according to claim 3, wherein the metal form and the body of the needle are both fixed on a micromanipulator arm and operated under a microscope.

* * * * *

UNITED STATES PATENT AND TRADEMARK OFFICE
CERTIFICATE OF CORRECTION

PATENT NO. : 10,823,758 B2
APPLICATION NO. : 16/086821
DATED : November 3, 2020
INVENTOR(S) : Jianxun Xu and Yuliang Zhao Page 1 of 1

It is certified that error appears in the above-identified patent and that said Letters Patent is hereby corrected as shown below:

In the Specification
Column 7, Line 7, change "1 and the apex angle was about) 60°" to
--1 μm, and the apex angle was about 60°)--

Signed and Sealed this
Twelfth Day of January, 2021

Andrei Iancu
*Director of the United States Patent and Trademark Office*